United States Patent [19]
Liu et al.

[11] Patent Number: 5,702,958
[45] Date of Patent: *Dec. 30, 1997

[54] METHOD FOR THE FABRICATION OF BIPOLAR TRANSISTORS

[75] Inventors: William U. Liu; Darrell G. Hill, both of Plano, Tex.

[73] Assignee: Texas Instruments Incorporated, Dallas, Tex.

[*] Notice: The term of this patent shall not extend beyond the expiration date of Pat. No. 5,445,976.

[21] Appl. No.: 287,568

[22] Filed: Aug. 9, 1994

[51] Int. Cl.$^6$ .................................................. H01L 21/265
[52] U.S. Cl. ........................... 437/31; 437/126; 437/133; 148/DIG. 11; 148/DIG. 72
[58] Field of Search ..................... 437/31, 126, 133, 437/228; 148/DIG. 10, DIG. 11, DIG. 72

[56] References Cited

U.S. PATENT DOCUMENTS

| | | | |
|---|---|---|---|
| 4,839,304 | 6/1989 | Morikawa | 437/29 |
| 5,024,958 | 6/1991 | Awano | 437/133 |
| 5,296,389 | 3/1994 | Shimawaki | 437/133 |
| 5,298,438 | 3/1994 | Hill | 437/133 |
| 5,389,554 | 2/1995 | Liu et al. | 437/133 |
| 5,434,091 | 7/1995 | Hill et al. | 437/31 |
| 5,445,976 | 8/1995 | Henderson et al. | 437/60 |

FOREIGN PATENT DOCUMENTS

| | | | |
|---|---|---|---|
| 0124465 | 5/1988 | Japan | 437/31 |
| 0159036 | 6/1990 | Japan | 437/31 |
| 2-235341 A | 9/1990 | Japan | H01L 21/331 |
| 3108339 | 5/1991 | Japan | 437/31 |
| 0240269 | 10/1991 | Japan | 437/31 |

*Primary Examiner*—Tuan H. Nguyen
*Attorney, Agent, or Firm*—Christopher L. Maginniss; W. James Brady, III; Richard L. Donaldson

[57] ABSTRACT

The invention described herein includes, in one of its forms, a method for fabricating a semiconductor device having ledge material (148, 150, 152, 162) extending over an undercut region. The method comprises the step of forming a layer of material 164 in tensile stress over the undercut region, or region to be undercut. The layer of material in tensile stress can be a dielectric, such as silicon nitride, and provides support for the ledge material in subsequent processing steps.

12 Claims, 7 Drawing Sheets

METHOD FOR THE FABRICATION OF BIPOLAR TRANSISTORS

CROSS REFERENCE TO RELATED APPLICATIONS

The following applications contain subject matter related to the present application and are assigned to the assignee of the present application: application Ser. No. 07/938,190 filed Aug. 31, 1992, application Ser. No. 08/112,009 filed Aug. 25, 1993, application Ser. No. 08/056,004, filed Apr. 30, 1993, and co-filed applications with Ser. Nos. 08/287,741, 08/287,567.

FIELD OF THE INVENTION

This invention generally relates to high performance bipolar transistors, and more specifically to transistors having reduced base-collector capacitance.

BACKGROUND OF THE INVENTION

Heterojunction bipolar transistors (HBTs) exhibit desirable features such as high power density and an extremely high cut-off frequency as compared to other devices like MESFETs. Even so, HBTs intended for microwave power applications require ever-increasing power gain and efficiency. It is well-known that power gain is inversely proportional to base-collector capacitance. Hence, a transistor that has its base-collector capacitance reduced by a factor of two can produce approximately 3 dB more in power gain.

Previous partial solutions addressing this base-collector capacitance have tended to produce transistors with inferior performance because the process of reducing base-collector capacitance often results in an increase in other parasitic impedances. For example, one simple method of reducing base-collector capacitance is to minimize the base contact area. However, this involves a design tradeoff between base resistance, which improves with increasing contact area, and junction capacitance, which degrades with increasing contact area. Another past effort was the ion bombardment of the extrinsic base region (see Japanese Patent No. 2-235341). Ion bombardment reduces the effective doping density of the layer beneath the base in the extrinsic base region. At best, this approach ensures that the collector layer beneath the extrinsic base is depleted of free carriers. This increases the effective dielectric thickness between the base and the underlying subcollector, thereby reducing the capacitance between those layers. A disadvantage of the ion bombardment approach is that the bombardment of the base layer results in increased base resistance. In addition, this technique requires great sensitivity, as it may result in reduced device reliability and degraded device current gain. Another problem is that it only reduces zero-bias base-collector capacitance.

Another approach taken in the prior art has been to include a layer in the material structure next to the collector layer. This layer is of a material that allows it to be easily removed without removing the surrounding material. In other words, the layer may be selectively etched. An example of this approach is shown in FIG. 1, where the transistor is an emitter-up type that is fabricated on a monolithic semiconductor substrate 20. The transistor comprises an emitter mesa 30 and emitter contact 32 over base 28 and collector 28 layers. The transistor shown includes an etch layer 24 between the subcollector 22 and the collector 26 layers. The etch layer allows the area of the interface between the lightly doped collector layer 26 and the highly doped subcollector layer 22 to be decreased. This also has the effect of lowering the overall base-collector capacitance. The problem with this approach is that it is difficult to reproducibly perform the selective etch so that the degree of undercut is the same across a semiconductor wafer or from wafer to wafer. In addition, the ledge comprising the base layer 28 and base contact 34, and that overhangs the undercut region, is prone to breakage in subsequent processing steps. The present invention is intended to address these problems.

SUMMARY OF THE INVENTION

The invention described herein includes, in one of its forms, a method for fabricating a semiconductor device having ledge material extending over an undercut region. The method comprises the step of forming a layer of material in tensile stress over the undercut region, or region to be undercut. The layer of material in tensile stress can be a dielectric, such as silicon nitride, and provides support for the ledge material in subsequent processing steps.

DETAILED DESCRIPTION OF PREFERRED EMBODIMENTS

A first preferred embodiment of the invention is described with reference to FIGS. 2 to 7. Two material structures that may be used for this embodiment are described in Table Ia and Ib.

TABLE Ia

| Element | Generic Name | Preferred Material | Examples of Alternate Materials | Approximate Layer Thickness | Approximate Doping ($cm^{-3}$) |
|---|---|---|---|---|---|
| 54 | Emitter contact | InGaAs | | 700 Å | $1 \times 10^{19}$ |
| 52 | Buffer | GaAs | | 1000 Å | $5 \times 10^{18}$ |

TABLE Ia-continued

| Element | Generic Name | Preferred Material | Examples of Alternate Materials | Approximate Layer Thickness | Approximate Doping (cm$^{-3}$) |
|---|---|---|---|---|---|
| 50 | Emitter | AlGaAs | GaInP | 1000 Å | $5 \times 10^{17}$ |
| 48 | Base | GaAs | | 800 Å | $2 \times 10^{19}$ |
| 46 | Collector | GaAs | | 1 µm | $2 \times 10^{16}$ |
| 44 | Etch layer | AlGaAs | AlAs, GaInP | 3000 Å | undoped |
| 42 | Subcollector | GaAs | | 1 µm | $2 \times 10^{18}$ |

TABLE Ib

| Element | Generic Name | Preferred Material | Examples of Alternate Materials | Approximate Layer Thickness | Approximate Doping (cm$^{-3}$) |
|---|---|---|---|---|---|
| 54 | Emitter contact | InGaAs | | 700 Å | $5 \times 10^{17}$ |
| 52 | Buffer | GaAs | | 500 Å | $3 \times 10^{19}$ |
| 50 | Emitter | AlGaAs | GaInP | 1500 Å | $3 \times 10^{17}$ |
| 48 | Base | GaAs | | 800 Å | $4 \times 10^{19}$ |
| 46 | Collector | GaAs | | 1 µm | $2 \times 10^{16}$ |
| 44 | Etch layer | AlGaAs | AlAs, GaInP | 500 Å | $2 \times 10^{16}$ |
| 42 | Subcollector | GaAs | | 1 µm | $2 \times 10^{18}$ |

Figure 2:
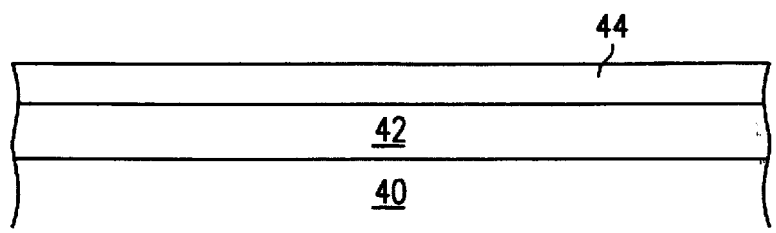
FIGS. 2–10 are cross-sectional views of a first preferred embodiment transistor at various stages of an embodiment process.
Figure 3:
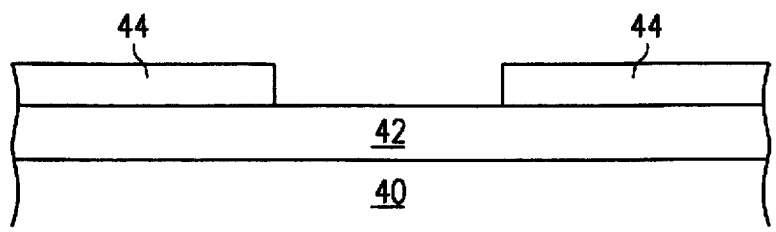

The first step in the process is to firm a highly doped subcollector layer 42 over a semiconductor substrate 40. In the embodiments described herein the substrate is GaAs, but transistors fabricated on other materials such as silicon (Si), indium phosphide (InP), and so forth may also obtain benefit from the invention. The layers in the embodiments described herein are typically epitaxially formed with a common technique such as molecular beam epitaxy (MBE), metal-organic chemical vapor deposition (MOCVD), or metal-organic molecular beam epitaxy (MOMBE). Etch layer 44 is then formed over the subcollector layer 42 as shown in FIG. 2. The substrate is then removed from the MBE, MOCVD, or MOMBE apparatus. Photoresist (not shown) is patterned over etch layer 44, and the uncovered portions are removed as shown in FIG. 3. The width of the uncovered portion defines the extent of the collector undercut of the finished transistor. It is important that the undercut not extend into the high-current-carrying region of the transistor's collector that lies directly beneath the emitter. Therefore, the width of the uncovered portion is typically chosen to extend approximately 0.25 µm beyond the edges of the high-current region generally defined by the location and boundaries of the emitter (formed in later process steps).

Figure 4:
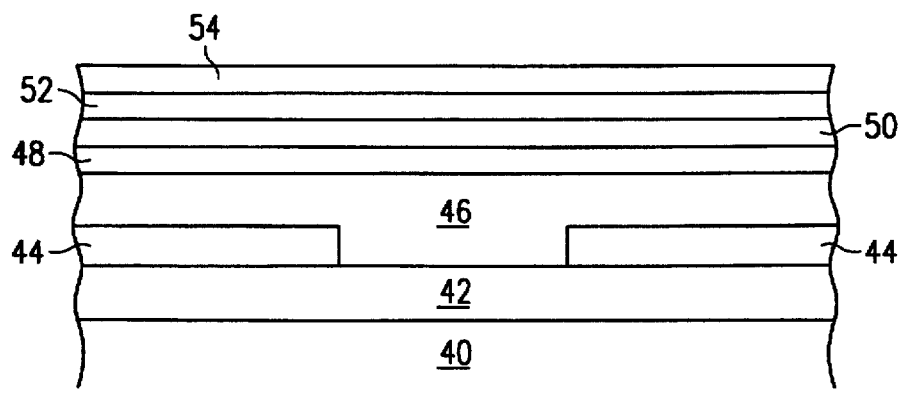

Referring now to FIG. 4, the lightly doped collector layer 46 is then grown by MBE, MOCVD, or MOMBE to fill the space left by the removal of a portion of layer 44 and also to form the collector of the transistor. The space is filled by growth on layer 42 as well as on the vertical sidewalls of layer 44. Layer 46 is essentially planar after about 0.5 um of growth. The quality of the interface between the vertical sidewalls of layer 44 and layer 46 and between layer 42 and layer 46 is important to the performance of the transistor. As described in co-assigned application Ser. No. 08/056,004, the quality of the overgrowth interface has been shown to be dependent on the crystallogzraphic orientation of the substrate 40. The use of a substrate with a precise orientation of (100) (within a tolerance of 0.5°) avoids ledges that can form during epitaxial overgrowth and that adversely impact the quality of the layers subsequently grown on the structure. After collector layer 46 is grown, base layer 48, emitter layer 50, buffer layer 52, and emitter contact layer 54 may be formed in a conventional manner.

Figure 5:
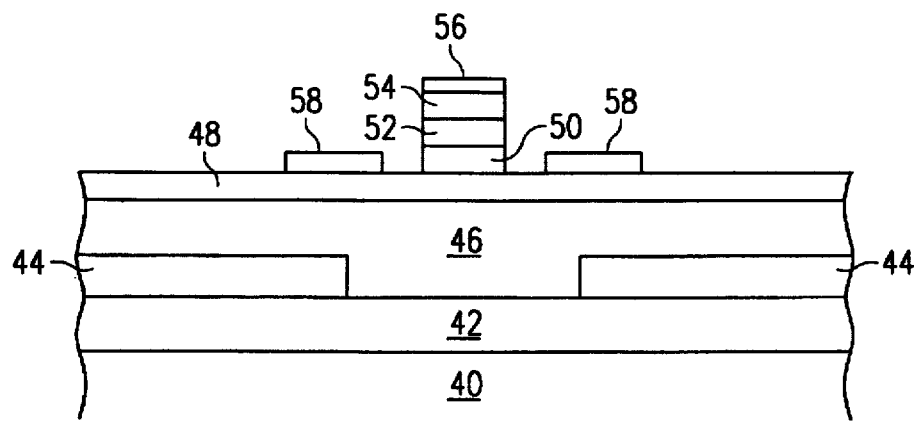

Referring now to FIG. 5, an emitter mesa is formed by depositing emitter contact metallization 56 of an alloy such as TiPtAu, AuGeNi, and so forth, on emitter contact layer 54. The emitter contact metallization is typically approximately 2.5 µm in width. Portions of layers 54, 52, and 50 not covered by emitter metallization 56 are then removed. Base contact metallization 58, also of TiPtAu, AuGeNi, or similar such alloys, are then formed on base layer 48.

Figure 6:
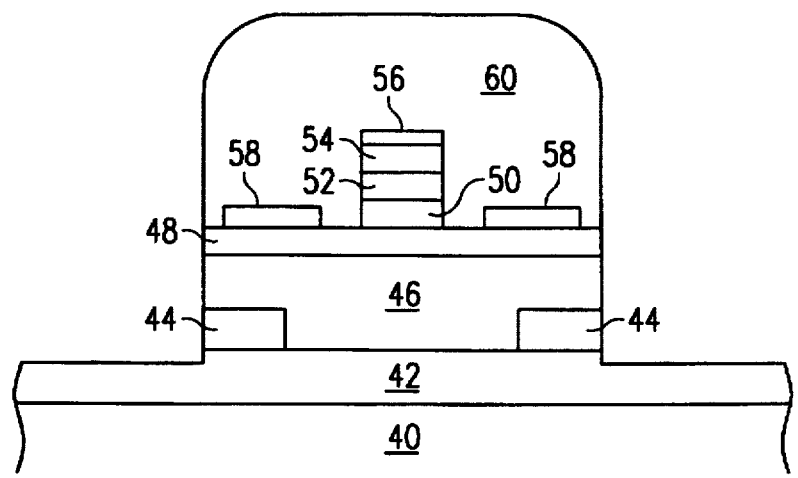

Photoresist 60 is then patterned over the emitter mesa and the base contact metallization 58 as shown in FIG. 6. The collector 46 and etch 44 layers are then removed from areas not covered by photoresist. This exposes the edges of etch layer 44.

Figure 7:
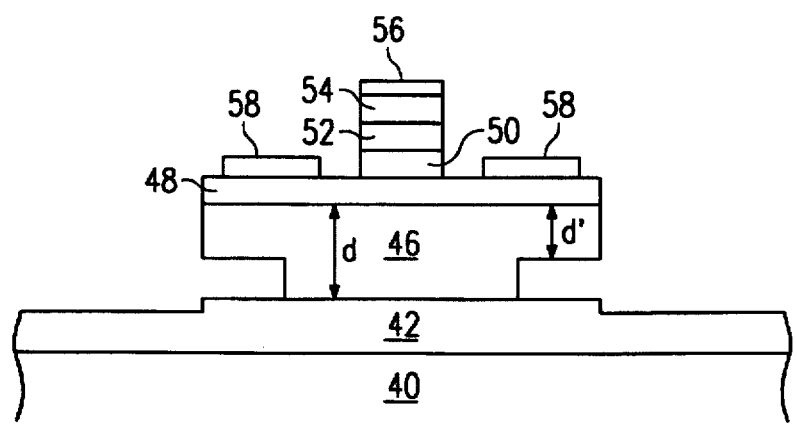

Referring now to FIG. 7, the etch layer 44 is then removed. If the etch layer 44 is AlAs (or AlGaAs with an aluminum content of greater than approximately 40%), a chemical such as hydrofluoric acid (HF) can be used to remove the etch layer 44 without affecting layers 48, 46, or 42, which in this embodiment are made of GaAs. It should be noted that AlAs tends to oxidize readily when exposed to air. Therefore, a thin layer of another material, such as GaAs may be grown over layer 44 in FIG. 2. This generally prevents the AlAs from oxidizing when the wafer is removed from the growth chamber for the etch step shown in FIG. 3. As an alternative to AlAs, AlGaAs may be used as an etch layer. If the aluminum content is greater than approximately 40%, the selectivity in etchability between AlGaAs and GaAs is acceptable. AlGaAs possesses the benefit of not readily oxidizing when exposed to the atmosphere. If a material such as GaInP is used for the etch layer 44, a chemical such as hydrochloric acid (HCl) or a combination of hydrochloric and phosphoric acid (HCl+H$_3$PO$_4$) in the ratio of three parts H$_3$PO$_4$ to 1 part HCl by volume can be used to remove the etch layer without affecting the surrounding layers of GaAs.

Figure 1:
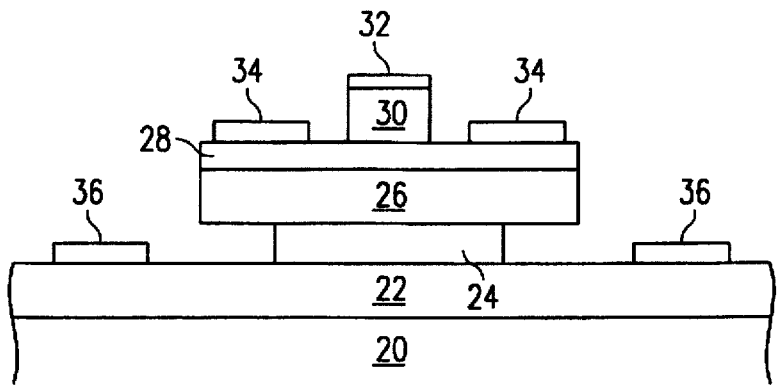
FIG. 1 is a cross-sectional view of a prior art transistor.

An advantage of this technique is that there is no need to strip photoresist 60 and reapply photoresist to cover the edges of the base mesa as in prior art techniques where the collector layer itself is removed, see Japanese Patent Number 3-108339. Additionally, the extent of the undercut is predetermined by the initial etch pattern of the etch layer 44 shown in FIG. 3. This eliminates the process variability that has plagued the prior art approach shown in FIG. 1, which relies on a timed etch to create the undercut of the collector layer.

Figure 8:
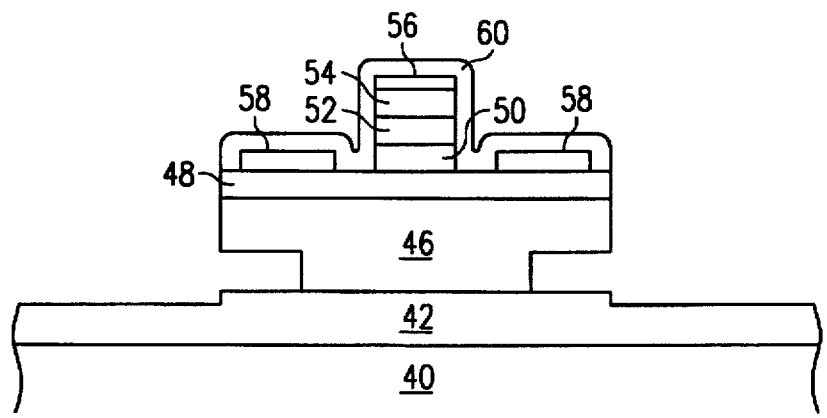
Figure 9:
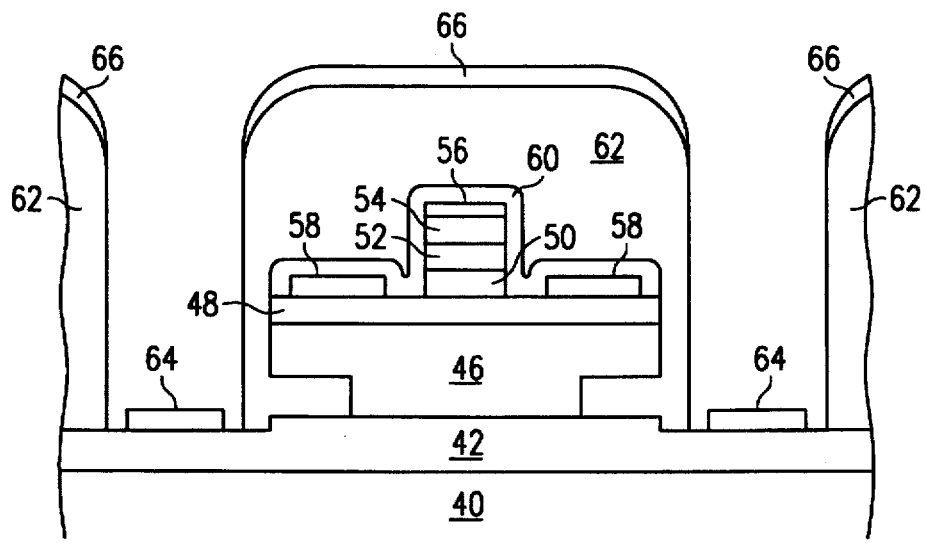

Referring to FIG. 8, an additional processing step is the deposition of a layer of a passivating dielectric 60, the purpose of which is to prevent the collapse of the mesa ledge that overhangs the undercut region. In subsequent processing steps, like the collector metal liftoff shown in FIG. 9, the ledge is subjected to forces that can cause it to break. The tensile stress of the thin layer 60 is sufficient to prevent the ledge from succumbing to the downward force encountered in the liftoff process. A wide variety of materials are suitable for this function, but ones that are usually readily available in semiconductor processing are dielectrics like silicon nitride ($Si_3N_4$), silicon dioxide ($SiO_2$), polyimide, or oxynitride. Similarly, the thickness of the dielectric layer is not critical. The layer is preferably about 2000 Å or greater, but the minimum thickness actually only depends on the thickness of the ledge being protected and on the forces encountered in processing. A typical transistor will have an undercut on the order of 1 um with a 3000 Å ledge overhanging the undercut. A layer of nitride 2000 Å thick has been shown to be very effective in preventing breakage of the ledge.

Figure 10:
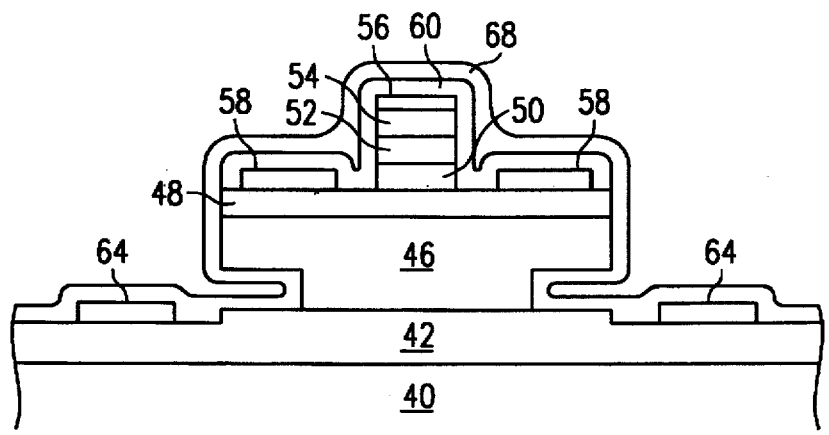

After the collector metal (FIG. 9) is lifted off, a passivating layer of dielectric 68 can be applied to the entire structure. This passivating layer will preferably conformally coat the undercut region as shown in FIG. 10. The layer of air left in the undercut region serves to decrease the capacitance between layers 48 and 42 more than if the undercut region is completely filled with dielectric. However, even a completely dielectric-filled undercut region provides an advantage in base-collector capacitance in comparison to a transistor lacking an undercut.

In a second preferred embodiment, the etch layer is moved down into the highly doped subcollector layer. Two material structures that may be used for this embodiment are described in Table IIa and IIb.

TABLE IIa

| Element | Generic Name | Preferred Material | Examples of Alternate Materials | Approx. Layer Thickness | Approx. Doping ($cm^{-3}$) |
|---|---|---|---|---|---|
| 94 | Emitter contact | InGaAs | | 700 Å | $1 \times 10^{19}$ |
| 92 | Buffer | GaAs | | 1000 Å | $5 \times 10^{18}$ |
| 90 | Emitter | AlGaAs | GaInP | 1000 Å | $5 \times 10^{17}$ |
| 88 | Base | GaAs | | 800 Å | $2 \times 10^{19}$ |
| 86 | Collector | GaAs | | 1 µm | $2 \times 10^{16}$ |
| 84 | Filled subcollector | GaAs | | 1 µm | $2 \times 10^{18}$ |
| 83 | Etch layer | AlGaAs | AlAs, GaInP | 3000 Å | undoped |
| 82 | Subcollector | GaAs | | 1 µm | $2 \times 10^{18}$ |

TABLE IIb

| Element | Generic Name | Preferred Material | Examples of Alternate Materials | Approx. Layer Thickness | Approx. Doping ($cm^{-3}$) |
|---|---|---|---|---|---|
| 94 | Emitter contact | InGaAs | | 700 Å | $1 \times 10^{19}$ |
| 92 | Buffer | GaAs | | 2000 Å | $1 \times 10^{19}$ |
| 90 | Emitter | AlGaAs | GaInP | 700 Å | $5 \times 10^{17}$ |
| 88 | Base | GaAs | | 800 Å | $4 \times 10^{19}$ |
| 86 | Collector | GaAs | | 1 µm | $2 \times 10^{16}$ |
| 84 | Filled subcollector | GaAs | | 1 µm | $2 \times 10^{18}$ |
| 83 | Etch layer | AlGaAs | AlAs, GaInP | 500 Å | $3 \times 10^{18}$ |
| 82 | Subcollector | GaAs | | 1 µm | $2 \times 10^{18}$ |

Figure 11:
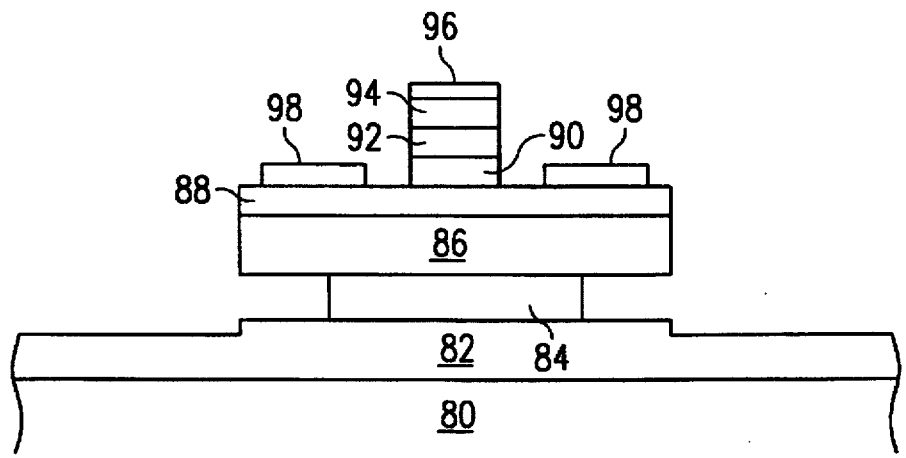
FIG. 11 is a second preferred embodiment transistor.
Figure 12:
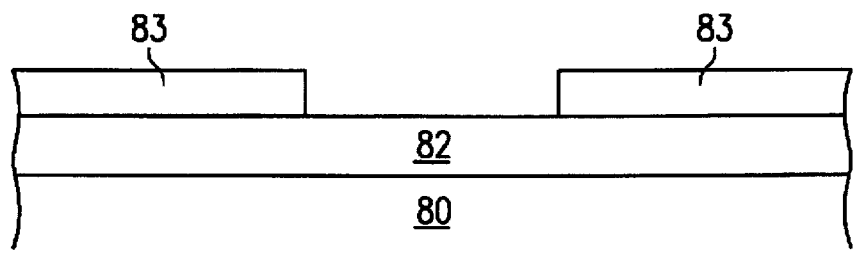
FIGS. 12–14 are views of a second preferred embodiment transistor at various stages in an embodiment process.
Figure 13:
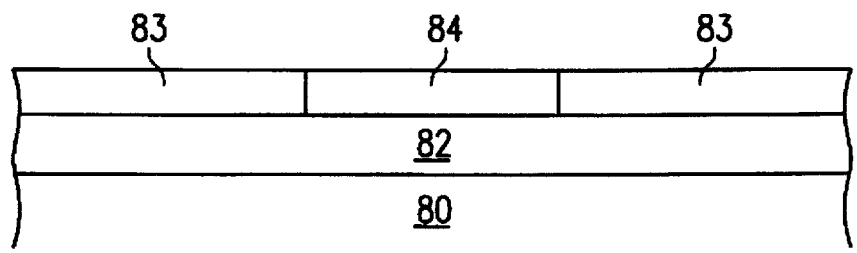
Figure 14:
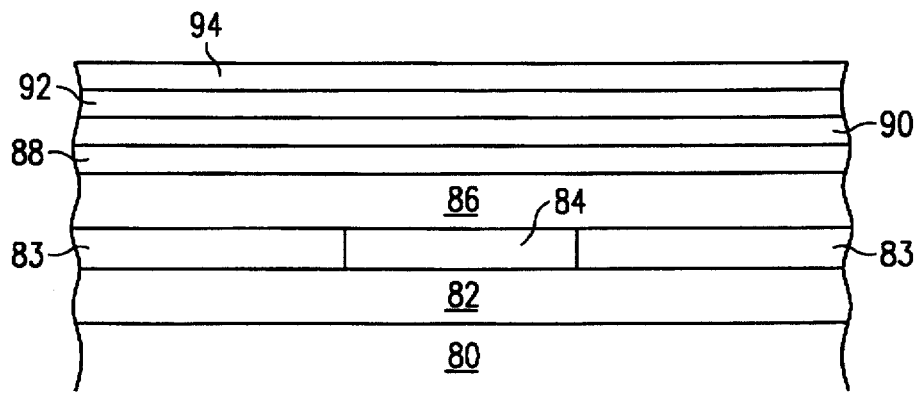

A cross-sectional diagram of the transistor is shown in FIG. 11. The structure is generally the same as that of the first preferred embodiment, except that the space left following the removal of a portion of etch layer 83 (FIG. 12) is filled with semiconductor 84 having a doping concentration on the order of that used for subcollector layer 82, rather than the much lighter doped layer 46 used in the first preferred embodiment. Additionally, the highly doped layer 84 is grown only to the top of the depression in layer 83 as shown in FIG. 13. As in the first preferred embodiment the collector layer 86, base layer 88, emitter layer 90, buffer layer 92 and contact layer 94 are grown in a conventional manner atop layers 83 and 84 as shown in FIG. 14.

Figure 15:
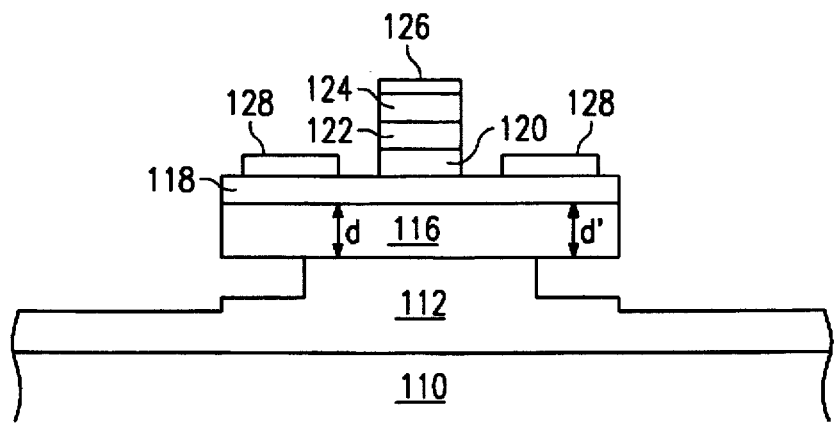
FIG. 15 is a third preferred embodiment transistor.
Figure 16:
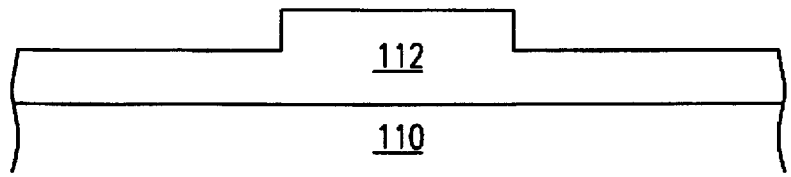
FIGS. 16–18 are views of a third preferred embodiment transistor at various stages in an embodiment process.
Figure 17:
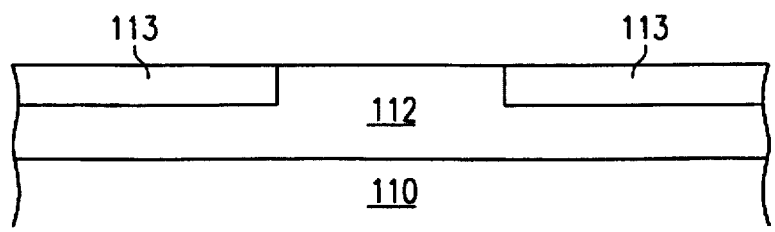
Figure 18:
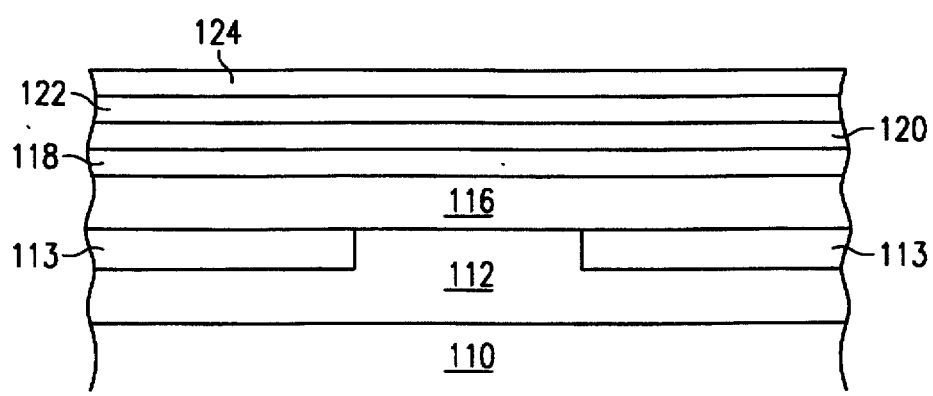

Similarly, in a third preferred embodiment shown in FIG. 15, the subcollector layer 112 is even with the top of the undercut region. In this embodiment, the subcollector layer 112 is initially etched to form a mesa as shown in FIG. 16. The etch layer 113 is then formed with the overgrowth process described above for the first preferred embodiment. Subsequently, the collector 116, base 118, emitter 120, buffer 122, and emitter contact 124 layers may be formed in a conventional manner atop layers 112 and 113. Two material structures that may be used in this embodiment are described in Table IIIa and Table IIIb.

TABLE IIIa

| Element | Generic Name | Preferred Material | Examples of Alternate Materials | Approx. Layer Thickness | Approx. Doping (cm$^{-3}$) |
|---|---|---|---|---|---|
| 124 | Emitter contact | InGaAs |  | 700 Å | $1 \times 10^{19}$ |
| 122 | Buffer | GaAs |  | 1000 Å | $5 \times 10^{18}$ |
| 120 | Emitter | AlGaAs | GaInP | 1000 Å | $5 \times 10^{17}$ |
| 118 | Base | GaAs |  | 800 Å | $2 \times 10^{19}$ |
| 116 | Collector | GaAs |  | 1 μm | $2 \times 10^{16}$ |
| 113 | Etch layer | AlGaAs | AlAs, GaInP | 3000 Å | undoped |
| 112 | Subcollector | GaAs |  | 1 μm | $2 \times 10^{18}$ |

TABLE IIIb

| Element | Generic Name | Preferred Material | Examples of Alternate Materials | Approx. Layer Thickness | Approx. Doping (cm$^{-3}$) |
|---|---|---|---|---|---|
| 124 | Emitter contact | InGaAs |  | 700 Å | $1 \times 10^{19}$ |
| 122 | Buffer | GaAs |  | 2000 Å | $1 \times 10^{19}$ |
| 120 | Emitter | AlGaAs | GaInP | 700 Å | $5 \times 10^{17}$ |
| 118 | Base | GaAs |  | 800 Å | $4 \times 10^{19}$ |
| 116 | Collector | GaAs |  | 1 μm | $2 \times 10^{16}$ |
| 113 | Etch layer | AlGaAs | AlAs, GaInP | 500 Å | $2 \times 10^{16}$ |
| 112 | Subcollector | GaAs |  | 1 μm | $2 \times 10^{18}$ |

The advantage of the second and third embodiments is that the distance d between the base layer (118 in FIG. 15) and the highly doped subcollector layer (112 in FIG. 15) is equivalent to the distance d' between the base layer 118 and the top of the undercut region. This is in contrast to the structure of FIG. 7 where the distance d between the base layer 48 and the highly doped subcollector layer 42 is greater than the distance d' between the base layer 48 and the top of the undercut region. The structure of the second and third embodiments can be expected to have a slight advantage in capacitance over that of the first preferred embodiment. For example, assuming that $C_1$ is the base-collector capacitance of a transistor lacking an undercut region and $C_2$ is the base-collector capacitance of the first embodiment transistor, the ratio of the two is given by the following relation:

$$\frac{C_2}{C_1} = \frac{w - 2L}{w} + \frac{2L}{w} \left( \frac{d}{d + \epsilon_g t} \right)$$

where w is the width of the base mesa, L is the extent of the undercut beneath the base mesa, t is the depth of the undercut, d is the distance between the base layer and the highly doped subcollector, d' is the distance between the base layer and the undercut (so d'=d−t), and $\epsilon_g$ is the dielectric constant. In the first preferred embodiment of the invention shown in FIG. 7, the distance d and the distance d' differ by the depth of the undercut, t. If d is 1 um, w is 4 um, L is 1 um and t is 0.1 um, the ratio of $C_2$ to $C_1$ is 0.725. In other words the capacitance of the undercut structure is only 72.5% of the capacitance of the structure without the undercut. However, if d' is the same as d, as in the second and third embodiments of the invention, the ratio of $C_2$ to $C_1$ is only 71.6%. It should be noted that the base-collector capacitance is greatly influenced by the depth or height of the undercut region. A depth of less than about 1000 Å results in little improvement in capacitance over a structure lacking and undercut, while an undercut depth of greater than approximately 1.5 um can result in a structure having dimensions unsuited to high frequency operation. Whatever the depth of the undercut region, the benefit of decreased base-collector capacitance is also dependent upon the material that fills the undercut region. It is preferable that a material having a low dielectric constant, such as air, fill the undercut to provide the lowest capacitance possible. However, it is often desirable to passivate the semiconductor surfaces of the undercut region with a dielectric such as $Si_3N_4$ or $SiO_2$. Preferably, this dielectric coating will conform to the surfaces of the undercut region and is thin enough to prevent complete filling of the undercut. Even a thin layer of air in the undercut provides a significant advantage in the capacitance of the structure. This approach is shown by nitride layer 68 in FIG. 10.

Figure 19:
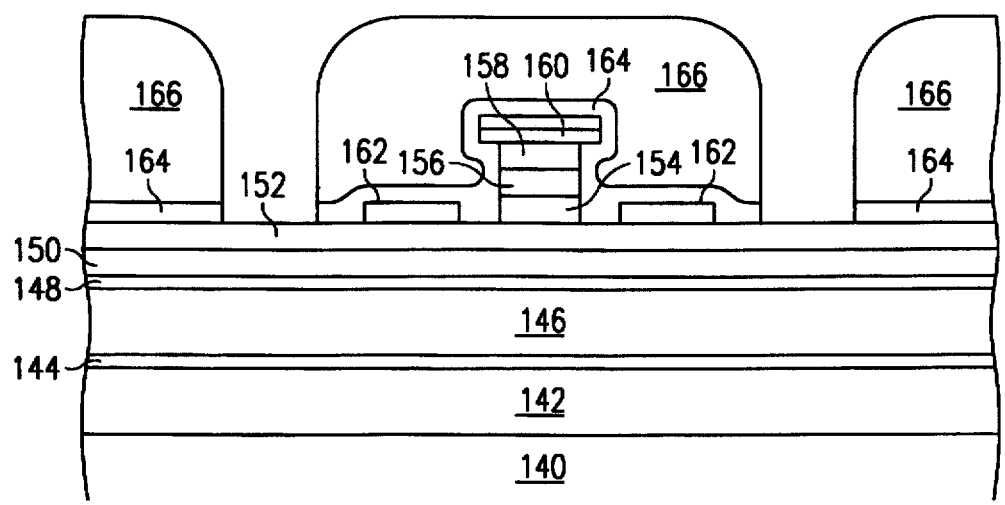
FIGS. 19–21 are cross-sectional views of a fourth preferred embodiment at various stages of an embodiment process.

In a fourth preferred embodiment of the invention, a thin layer of material, preferably a dielectric, is used to support an overhanging ledge. This is similar to the approach described in reference to the first preferred embodiment, but is applied to one of several processes that can be used to form the undercut feature. In FIG. 19 an emitter mesa and base contacts 162 have been formed on a material structure comprising a substrate 140, a subcollector layer 142, a lower etch stop layer 144, a collector layer 146, an upper etch stop layer 148, a buffer layer 150, a base layer 152, an emitter layer 154, an emitter cap layer 156, and an emitter contact layer 158. Two material structures that may be used in this embodiment are described in Table IVa and Table IVb. A layer of silicon nitride 164 approximately 2000 Å in thickness is formed to cover the emitter mesa and the base contacts 162. Photoresist 166 is patterned for the formation of the collector contacts in FIG. 19.

TABLE IVa

| | Element Generic Name | Preferred Material | Examples of Alternate Materials | Approximate Layer Thickness | Approximate Doping (cm$^{-3}$) |
|---|---|---|---|---|---|
| 158 | Emitter contact | InGaAs | | 700 Å | $1 \times 10^{19}$ |
| 156 | Emitter cap | GaAs | | 1000 Å | $5 \times 10^{18}$ |
| 154 | Emitter | AlGaAs | GaInP | 1000 Å | $5 \times 10^{17}$ |
| 152 | Base | GaAs | | 800 Å | $2 \times 10^{19}$ |
| 150 | Buffer | GaAs | | 2000 Å | $2 \times 10^{16}$ |
| 148 | Upper etch stop | AlGaAs | InGaAs | 500 Å | $2 \times 10^{16}$ |
| 146 | Collector | GaAs | | 7000 Å | $2 \times 10^{16}$ |
| 144 | Lower etch stop | AlGaAs | InGaAs | 500 Å | $2 \times 10^{16}$ |
| 142 | Subcollector | GaAs | | 1 μm | $2 \times 10^{18}$ |

TABLE IVb

| | Element Generic Name | Preferred Material | Examples of Alternate Materials | Approximate Layer Thickness | Approximate Doping (cm$^{-3}$) |
|---|---|---|---|---|---|
| 158 | Emitter contact | InGaAs | | 700 Å | $2 \times 10^{19}$ |
| 156 | Emitter cap | GaAs | | 1000 Å | $5 \times 10^{17}$ |
| 154 | Emitter | AlGaAs | GaInP | 1500 Å | $3 \times 10^{17}$ |
| 152 | Base | GaAs | | 800 Å | $4 \times 10^{19}$ |
| 150 | Buffer | GaAs | | 1000 Å | $2 \times 10^{16}$ |
| 148 | Upper etch stop | AlGaAs | InGaAs | 500 Å | $2 \times 10^{16}$ |
| 146 | Collector | GaAs | | 1 μm | $2 \times 10^{16}$ |
| 144 | Lower etch stop | AlGaAs | InGaAs | 500 Å | $3 \times 10^{19}$ |
| 142 | Subcollector | GaAs | | 1 μm | $3 \times 10^{18}$ |

Figure 20:
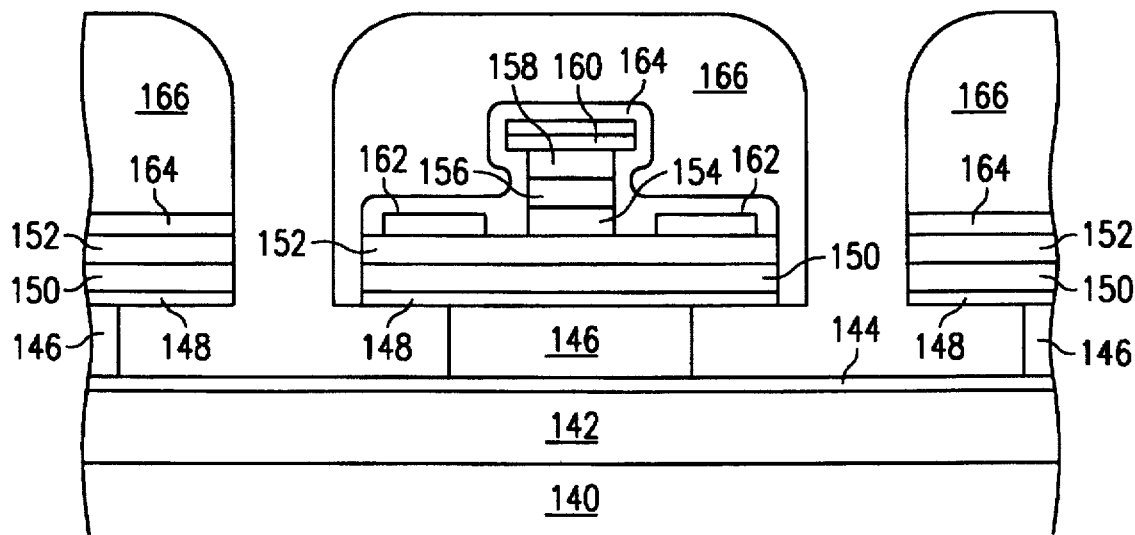

In FIG. 20, the base 152, buffer 150, upper etch stop 148 and collector 146 layers have been removed from the portion of the material structure left uncovered by the photoresist 166. The etch is allowed to continue after the lower etch stop layer 144 is exposed. This results in an undercutting of the base mesa as the etchant removes the collector layer 146 from between the etch stop layers 144 and 148. The etchant used to remove the collector layer should not attack the etch stop layers. In this embodiment, the collector layer 146 is GaAs, while the etch stop layers are AlGaAs or InGaAs. An etchant that removes GaAs without attacking the AlGaAs or InGaAs layers is BCl$_3$+SF$_6$, where the BCl$_3$ is in a higher proportion than the SF$_6$. The optimum ratio of BCl$_3$ to SF$_6$ is highly machine dependent.

Figure 21:
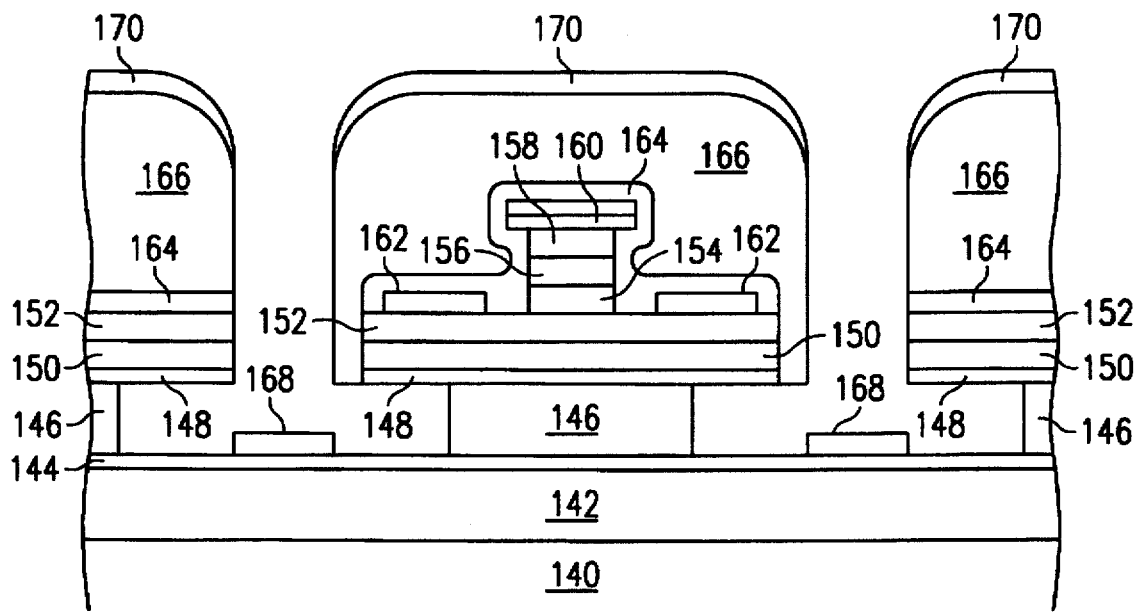

In FIG. 21, the collector contacts 168 are formed by evaporating metals such as TiPtAu, AuGeNi, and so forth over the structure. The contacts are then alloyed. Excess metal 170 is then removed with the photoresist 166 in a liftoff process. It is this step of the process that has plagued the prior art methods of fabricating an undercut transistor. The forces involved in dissolving and removing the photoresist 166 can collapse the thin ledge comprising the upper etch stop layer 148, the base layer 152, and the base contacts 162. It has been found that the thin layer of dielectric 164, which is in tensile stress, serves to support the ledge when the wafer is subjected to the liftoff process. This simple step has been found to dramatically improve the yield and reliability of transistors incorporating the undercut feature.

A few preferred embodiments have been described in detail hereinabove. It is to be understood that the scope of the invention also comprehends embodiments different from those described, yet within the scope of the claims. For example, in the embodiments described herein, an emitter-up configuration is described, though one may appreciate that a collector-up transistor may be similarly fabricated.

Internal and external connections can be ohmic, capacitive, inductive, direct or indirect, via intervening circuits or otherwise. Implementation is contemplated in discrete components or fully integrated circuits in silicon, gallium arsenide, or other electronic materials families, as well as in optical-based or other technology-based forms and embodiments.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. For example, though AlAs, AlGaAs, and GaInP were used as etch layer materials, it may be appreciated that any material that can be removed without affecting the layers adjacent to the etch layer is suitable. It is therefore intended that the appended claims encompass any such modifications or embodiments.

What is claimed is:

1. A method for fabricating a semiconductor device having semiconductor ledge material extending over an undercut region, said method comprising the step of forming a layer of material in tensile stress and coupled to said semiconductor ledge material over said undercut region or region to be undercut, said layer of material in tensile stress remaining over said undercut region or region to be undercut during steps of said method of fabrication following the formation of said undercut region, whereby said layer of material in tensile stress provides support for said semiconductor ledge material.

2. The method of claim 1 wherein said layer of material in tensile stress comprises a dielectric.

3. The method of claim 2 wherein said dielectric is chosen from the group consisting of silicon nitride, silicon oxide, polyimide, and oxynitride.

4. The method of claim 2 wherein said dielectric is silicon nitride.

5. A method for fabricating a bipolar transistor comprising the steps of:

a. providing a material structure including:
   a subcollector layer;
   a collector layer;
   a base layer over said subcollector layer; and
   an emitter layer over said base layer;

b. forming a base mesa by removing portions of said emitter and base layer, said base mesa lying over said collector and subcollector layer;

c. forming a layer of dielectric over said base mesa;

d. removing a portion of said collector layer from beneath said base mesa after said layer of dielectric is formed; and e. with said layer of dielectric still over said base mesa, forming contacts to said subcollector layer, whereby a ledge portion formed by said removal of said collector layer is mechanically supported by said layer of dielectric.

6. The method of claim 5 wherein said layer of dielectric is in tensile stress.

7. The method of claim 5 wherein said dielectric is chosen from the group consisting of silicon nitride, silicon oxide, polyimide, and oxynitride.

8. The method of claim 5 wherein said dielectric is silicon nitride.

9. A method for fabricating a bipolar transistor comprising the steps of:

a. providing a material structure including:
   a subcollector layer;
   a collector layer over said subcollector layer;
   a base layer over said subcollector layer; and
   an emitter layer over said base layer;

b. forming a base mesa by removing portions of said emitter and base layers, said base mesa lying over said collector and subcollector layers;

c. removing a portion of said collector layer from beneath said base mesa;

d. forming a layer of dielectric over said base mesa after said step of removing a portion of said collector layer, said layer of dielectric remaining over said base mesa during subsequent steps of said method of fabrication, whereby a ledge portion formed by said removal of said collector layer is mechanically supported by said layer of dielectric.

10. The method of claim 9 wherein said layer of dielectric is in tensile stress.

11. The method of claim 9 wherein said dielectric is chosen from the group consisting of silicon nitride, silicon oxide, polyimide, and oxynitride.

12. The method of claim 9 wherein said dielectric is silicon nitride.

* * * * *